US009627057B2

(12) United States Patent
Nazarian et al.

(10) Patent No.: US 9,627,057 B2
(45) Date of Patent: Apr. 18, 2017

(54) PROGRAMMING TWO-TERMINAL MEMORY CELLS WITH REDUCED PROGRAM CURRENT

(71) Applicant: Crossbar, Inc., Santa Clara, CA (US)

(72) Inventors: Hagop Nazarian, San Jose, CA (US); Sang Nguyen, Union City, CA (US)

(73) Assignee: CROSSBAR, INC., Santa Clara, CA (US)

( * ) Notice: Subject to any disclaimer, the term of this patent is extended or adjusted under 35 U.S.C. 154(b) by 248 days.

(21) Appl. No.: 13/954,853

(22) Filed: Jul. 30, 2013

(65) Prior Publication Data

US 2014/0268997 A1 Sep. 18, 2014

Related U.S. Application Data

(60) Provisional application No. 61/798,180, filed on Mar. 15, 2013.

(51) Int. Cl.
G11C 13/00 (2006.01)

(52) U.S. Cl.
CPC ...... *G11C 13/0069* (2013.01); *G11C 13/0002* (2013.01); *G11C 13/003* (2013.01); *G11C 13/0028* (2013.01); *G11C 2213/77* (2013.01); *G11C 2213/78* (2013.01); *G11C 2213/79* (2013.01)

(58) Field of Classification Search
CPC ............ G11C 13/0002; G11C 13/0028; G11C 13/003; G11C 13/0069; G11C 2213/77; G11C 2213/78; G11C 2213/79
See application file for complete search history.

(56) References Cited

U.S. PATENT DOCUMENTS

| 3,796,926 | A | 3/1974 | Cole et al. |
| 6,473,340 | B1 | 10/2002 | Pasotti et al. |
| 6,894,934 | B2 | 5/2005 | De Santis et al. |
| 7,561,461 | B2 * | 7/2009 | Nagai et al. .................. 365/148 |
| 7,808,815 | B2 * | 10/2010 | Ro et al. ........................ 365/163 |
| 7,824,956 | B2 | 11/2010 | Schricker et al. |
| 7,829,875 | B2 | 11/2010 | Scheuerlein |
| 8,054,679 | B2 * | 11/2011 | Nakai et al. .................. 365/163 |

(Continued)

FOREIGN PATENT DOCUMENTS

| EP | 1914806 A1 | 4/2008 |
| KR | 20110014248 A | 2/2011 |

(Continued)

*Primary Examiner* — Khamdan Alrobaie
(74) *Attorney, Agent, or Firm* — Amin, Turocy & Watson, LLP

(57) ABSTRACT

Providing for programming a two-terminal memory cell array with low sneak path current is described herein. Groups of two-terminal memory cells can be arranged into blocks or sub-blocks, along sets of bitlines and local wordlines. Further, groups of local wordlines within a given sub-block can be electrically isolated from bitlines outside the sub-block. A programming signal can be applied to the two-terminal memory cells from an associated local wordline thereof. Sneak path currents can be mitigated or avoided with respect to bitlines outside a particular sub-block, or on non-selected wordlines of the sub-block. This can significantly reduce a magnitude of combined sneak path current within the sub-block in response to the programming operation.

20 Claims, 10 Drawing Sheets

(56) References Cited

U.S. PATENT DOCUMENTS

| | | | |
|---|---|---|---|
| 2005/0270883 A1* | 12/2005 | Cho et al. | 365/230.03 |
| 2006/0250836 A1 | 11/2006 | Herner et al. | |
| 2009/0001345 A1 | 1/2009 | Schricker et al. | |
| 2009/0168486 A1 | 7/2009 | Kumar | |
| 2009/0256130 A1 | 10/2009 | Schricker | |
| 2010/0172170 A1* | 7/2010 | Tamai et al. | 365/148 |
| 2012/0008366 A1 | 1/2012 | Lu | |

FOREIGN PATENT DOCUMENTS

| | | |
|---|---|---|
| WO | 2005024839 A1 | 3/2005 |
| WO | 2007004843 A1 | 1/2007 |
| WO | 2007018026 A1 | 2/2007 |
| WO | 2007062022 A1 | 5/2007 |
| WO | 2009005699 A1 | 1/2009 |

* cited by examiner

PROGRAMMING TWO-TERMINAL MEMORY CELLS WITH REDUCED PROGRAM CURRENT

CROSS-REFERENCE TO RELATED APPLICATION

The instant patent application claims priority to and is a non-provisional application of U.S. Provisional Patent Application No. 61/798,180 filed on Mar. 15, 2013, which is incorporated by reference in its entirety herein for all purposes.

TECHNICAL FIELD

The subject disclosure relates generally to semiconductor memory technology; more particularly, some embodiments of the present disclosure relate to programming a two-terminal memory cell with low sneak path current.

BACKGROUND

The inventors of the present disclosure have been focusing research in the area of resistive memory within the field of integrated circuit technology. While much of resistive memory technology is in the development stage, various technological concepts for resistive memory have been demonstrated by the inventors, and are in one or more stages of verification to prove or disprove associated theory(ies). The inventors believe that resistive memory technology promises to hold substantial advantages over competing technologies in the semiconductor electronics industry.

The inventors of the present application for patent have studied resistive memory cells, such as resistive-switching memory. Resistive-switching memory can be configured to have a plurality of states with distinct resistance values. For instance, the plurality of states can include a relatively low resistance state and a relatively high resistance state, in a single bit cell. Multi-bit cells might have additional states with respective resistances that are distinct from each other and from the relatively low resistance state and the relatively high resistance state. The distinct resistance states of the resistive-switching memory cell represent distinct logical information states, facilitating digital memory operations. Accordingly, the inventors believe that arrays of many such memory cells can provide many bits of digital memory storage.

In various embodiments, the inventors induce resistive-switching memory cells to enter one or another resistive state in response to an external condition. Thus, in transistor parlance, applying or removing the external condition can serve to program or de-program (e.g., erase) the memory. Moreover, depending on physical makeup and electrical arrangement, the inventors maintain that a resistive-switching memory cell can generally maintain a programmed or de-programmed state. To have a memory cell maintain a state, the inventors recognize that other conditions be met (e.g., existence of a minimum operating voltage, existence of a minimum operating current, and so forth), or no conditions be met, depending on the characteristics of a memory cell device.

In light of the above, the inventors desire to make further innovations in the area of resistive semiconductor memory technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments of the subject disclosure relate to programming a two-terminal memory cell array with low sneak path current. In various disclosed aspects, the two-terminal memory cell array can be formed to have a set of bitlines connected at a first terminal of the memory cells of the array, and a set of local wordlines connected to a second terminal of the memory cells of the array. Particularly, respective local wordlines are electrically connected (through respective memory cells) with respective subsets of the bitlines, and are isolated from other subsets of the bitlines. A programming signal to program one (or more) of the two-terminal memory cells can be applied at an associated local wordline thereof. Sneak path currents are generated along an associated subset of the bitlines, but not on the other subsets of the bitlines isolated from the local wordline. Accordingly, the programming can facilitate larger arrays of memory cells with increased memory density (e.g., a 1 transistor-x memory cell configuration, with relatively large values of x).

In additional embodiments, the subject disclosure provides a memory cell configured to be programmed from a local wordline. For instance, in the case of a resistive-switching memory cell, an ion donor material facilitating formation of a conductive filament in the memory cell, can be formed adjacent to and electrically connected with the local wordline. Further, the resistive-switching memory cell can comprise a non-ion donor material formed adjacent to and electrically connected with a bitline. According to this configuration, the resistive-switching memory cell can be programmed with a positive signal applied at the local wordline.

In one or more other embodiments, the subject disclosure providers a memory. The memory can comprise a set of two-terminal memory cells having respective first terminals connected to one of a set of bitlines of the memory, and having respective second terminals connected to one of a set of local wordlines of the memory. The memory can additionally comprise a power source configured to be selectively connected to or disconnected from respective ones of the set of local wordlines. Moreover, the memory can comprise a memory controller configured to perform memory operations for the memory, and configured to program one memory cell of the set of two-terminal memory cells at least in part by: causing the power source to be selectively connected to one of the set of local wordlines that is connected to a second terminal of the one memory cell and causing the power source to apply a positive voltage to the one of the set of local wordlines.

In additional embodiments, disclosed is a method of operating a memory array. The method can comprise selecting a memory cell for programming in an array of two-terminal memory cells. In addition, the method can comprise applying a program signal to a non-global wordline that is electrically connected to a first of two terminals of the memory cell. Furthermore, the method can comprise applying a ground or a negative signal to a bitline that is electrically connected to a second of the two terminals of the memory cell.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
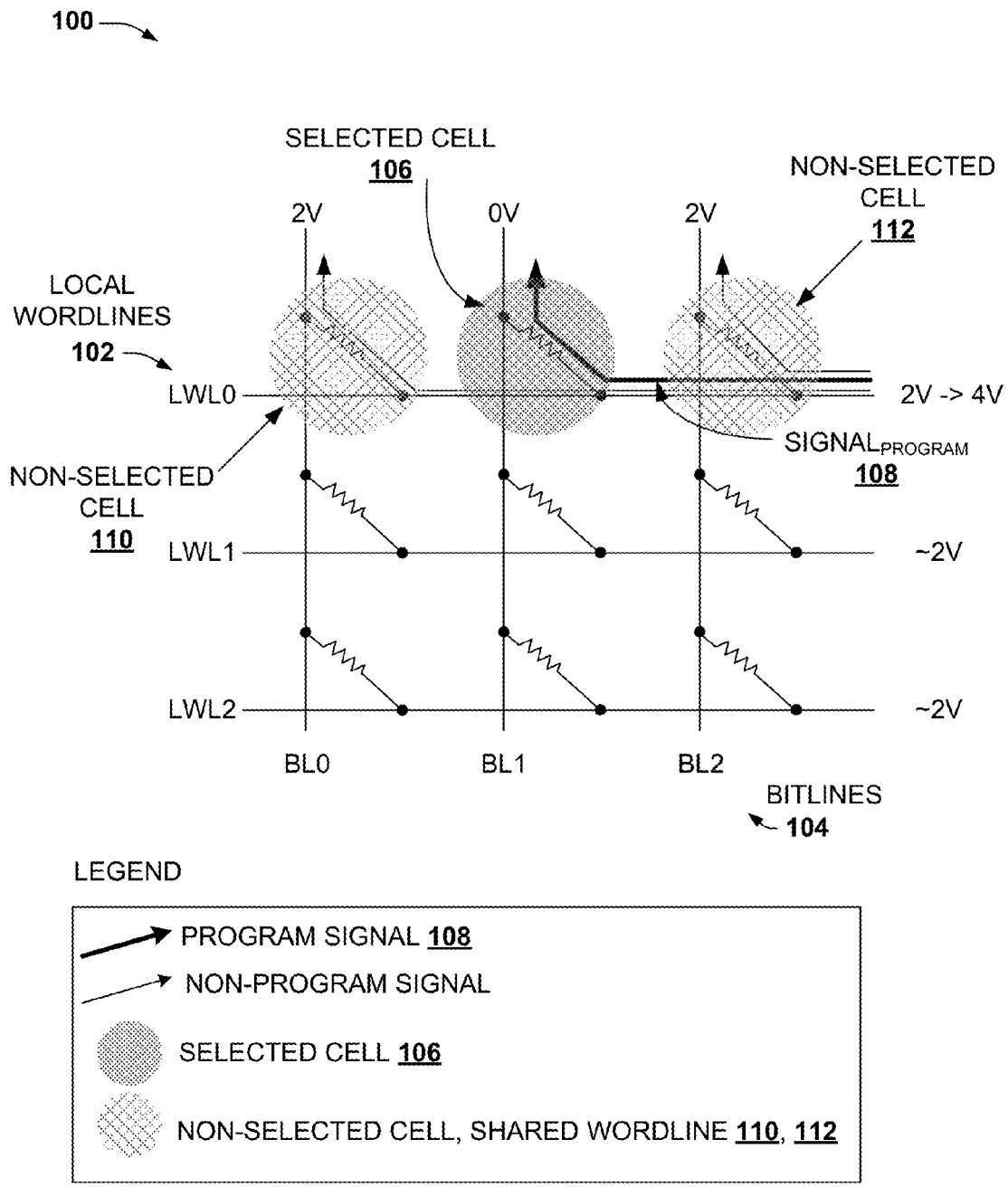
FIG. 1 depicts a schematic diagram of an example two-terminal memory array according to one or more aspects of the subject disclosure.

This disclosure relates to two-terminal memory cells, particularly resistive-switching two-terminal memory cells, in various embodiments. Resistive-switching two-terminal memory cells (also referred to as resistive-switching memory cells or resistive-switching memory), as utilized herein, comprise circuit components having two conductive contacts (also referred to herein as electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a p-type or n-type silicon (Si) bearing layer (e.g., p-type or n-type polysilicon, p-type or n-type SiGe, or the like), a resistive switching layer (RSL) and an active metal layer for providing filament forming ions to the RSL. The p-type or n-type Si bearing layer can include a p-type or n-type polysilicon, p-type or n-type SiGe, or the like. The RSL (which can also be referred to in the art as a resistive switching media (RSM)) can comprise, e.g., an undoped amorphous Si layer, a semiconductor layer having intrinsic characteristics, a Si sub-oxide, a SiGe sub-oxide, and so forth. Examples of the active metal layer can include, among others: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd)). Other suitable conductive materials, as well as compounds or combinations of the foregoing can be employed for the active metal layer in some aspects of the subject disclosure. In some embodiments, additional layers, such as a barrier layer may be disposed between the resistive switching layer and the active metal layer. In some examples, the additional layers may be thin, e.g. between about 1 nm to about 10 nm, and be titanium, tungsten, or the like. In other embodiments, additional layers, such as a tunneling barrier layer may be disposed between the conductive silicon bearing layer (described above) and a bottom electrode layer. In some examples the tunneling barrier layer may be thin, e.g. between about 10 Angstroms to about 30 Angstroms, and be an electrolyte (e.g. metal oxide, Tax, Fox, Nix, Tao, or the like). Some details pertaining to embodiments of the subject disclosure similar to the foregoing example can be found in the following U.S. patent applications that are licensed to the assignee of the present application for patent application Ser. No. 11/875,541 filed Oct. 19, 2007 and application Ser. No. 12/575,921 filed Oct. 8, 2009, each of which are incorporated by reference herein in their respective entireties and for all purposes.

The inventors have studied a variety of RSL memory cell technologies, having different physical properties. For instance, some embodiments of the subject disclosure can have different discrete programmable resistances, different associated program/erase voltages, as well as other differentiating characteristics. For instance, in a unipolar embodiment, once a memory cell is initially programmed, the memory cell can be later programmed in response to a first positive voltage (e.g., three volts) and erased in response to a second positive voltage (e.g., between four and five volts). Other embodiments can alternatively exhibit bipolar characteristics, and become programmed in response to a positive voltage and erased in response to a negative voltage. Where an embodiment described herein does not specify a unipolar or bipolar characteristic, or does not indicate suitable program/erase voltages, it is intended that such aspects and embodiments incorporate any suitable memory cell technology and be operated by program/erase voltages appropriate to that memory cell technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. The inventors of the subject application recognize technical limitations associated with respective ones of these two-terminal memory structures.

An example of a conductive filament previously studied by the inventors is a three-layer memory cell arrangement of metal/amorphous Si (a-Si)/metal. This three-layer memory cell is an example of an a-Si resistive switching device. The a-Si layer essentially serves as a digital information storage medium. A resistive switching behavior is often characterized in terms of conductive filament formation inside an otherwise non-conductive a-Si material.

To program a conductive filament device, a suitable program voltage can be applied across the memory cell causing a conductive filament to form through a resistive portion of the memory cell, as mentioned above. This can further cause the memory cell to switch from a relatively high resistive state, to a relatively low resistive state. An erase process can be implemented to reverse the foregoing, at least in part, causing the memory cell to return to a high or the high resistive state from the low resistive state. This change of state, in the context of memory, can be associated with respective states of a binary bit. Accordingly, multiple such memory cells can be programmed or erased to represent respective zeroes or ones of binary information, and by retaining those states over time in effect storing binary information. For various reasons, resistive switching memory cells are generally quick to program and responsive, changing state readily in response to a program voltage. This quick switching of state is a significant advantage of various disclosed memory cells over other memory cell technologies.

In various embodiments, a memory array is often constructed in blocks (or sectors) with respective x and y decoders to access wordlines and bitlines of the block. The y decoder is utilized to select a group of bitlines for programming or reading, or selects another group of bitlines to be inhibited from programming based on a set of data (e.g., a pattern of the data) to be programmed to the block. The x decoder selects one or more wordlines or a row of memory. Memory cells located at an intersection of a selected wordline and one or more bitlines can be programmed with the set of data. Generally, programming is performed when the y decoder passes a supply voltage to a selected bitline(s), and the x decoder connects electrical ground or other suitable constant voltage to a selected wordline(s).

A size of a block of memory can affect efficiency and die size of an integrated circuit. The larger the memory block (e.g., 1 megabyte, 2 megabyte, 4 megabyte, etc.), the smaller the relative impact in terms of area consumption of the y decoder. Thus, having large block sizes can be desirable to reduce overall die size of the integrated circuit (or increase memory density on the integrated circuit). Large block sizes can have drawbacks, however, in terms of longer bitlines (e.g., impacting operational speed) and more power consumption (e.g., increased transient or DC current). In the case of a crossbar two-terminal memory array, the inventors of the subject application believe that larger block size will increase sneak path currents within the block of memory, reducing sensing margin, increasing current and power consumption, and potentially causing memory errors. The inventors further believe that with advanced nanometer (nm) technology nodes (e.g., 20 nm nodes or smaller), high current could be a significant obstacle and can cause product performance and product reliability problems as well.

In one example memory architecture, memory cells can be arranged in a two-dimensional array of rows and columns within respective blocks of memory. A block of memory can have a set of bitlines and a set of global wordlines, the bitlines being connected to a first terminal of respective columns of memory cells. In some memory architectures, the global wordlines can be connected to second terminals of respective rows of memory cells. In other memory architectures, the global wordlines are utilized to activate or deactivate respective sets of local wordlines, which are connected to the second terminals of respective subsets of memory cells in a row. In the latter case, a source line can be provided, which is connected to or disconnected from local wordlines by an associated one of the global wordlines (e.g., see FIG. 5, infra).

A programming operation for a memory architecture such as that described above, often involves two phases, a pre-charge phase and a program phase. During the pre-charge phase bitlines and source lines are biased at an intermediate voltage (e.g., about two volts). During the programming phase, a selected bitline is increased in voltage to a program voltage (e.g., about four volts), and a selected local wordline is discharged to zero volts, by first applying zero volts to all unselected global wordlines and applying zero volts on a selected source line. This operation generates a potential difference of greater than or about the program voltage across a selected memory cell to program the selected cell. However, the program voltage applied to the selected bitline will cause a leakage current (also referred to as a sneak current, or sneak path current) through unselected memory cells of a sub-block of the memory, to the intermediate voltage supply (e.g., the two volt supply). A number of leakage currents in a sub-block of memory can increase with the number of wordlines in the sub-block, or with the number of bitlines in the sub-block, or both, depending on a schematic arrangement of a particular memory block. The magnitude of respective paths of leakage current can depend on a program or erase pattern of memory cells in the sub-block. For example, in a memory block comprising resistive-switching memory cells having high resistance when erased and low resistance when programmed, the leakage current through programmed memory cell paths will be substantially larger.

As a particular example, consider a sub-block of memory having eight bitlines and 512 wordlines (e.g., a 4 kilobit [kb] sub-block). Thus, when programming a memory cell on a selected one of the eight bitlines, a program voltage will be applied to the selected bitline, and an intermediate voltage to the 7 unselected bitlines. This results in seven distinct paths. Moreover, each bitline has 512 local wordlines, including a selected local wordline connected to the memory cell. Thus, the program voltage has a path to each of the 7 unselected bitlines through 511 local wordlines, in addition to the selected local wordline. Accordingly, a number of leakage paths per selected bitline is equal to a (number of local wordlines−1)*(number of bitlines−1). As mentioned above, leakage current magnitude depends on a program/erase state of unselected memory cells in this architecture. For the case where all memory cells are programmed (maximum magnitude scenario), total sneak path current per selected bitline will be $I_{cell}$ (for a given potential difference)*(number of wordlines−1). If $I_{cell}$ is about 5 microamps (uA), for instance, total sneak path current on the selected bitline will be 5 uA*511 wordlines, or about 2.5 milliamps (mA). This can be quite a large current for integrated circuit applications. Further, the sneak current can increase with increasing block or sub-block size. Accordingly, the efficiencies of larger block sizes can involve quite large power supplies, heat sinks, and so on, impacting die size and memory density.

Various aspects of the subject disclosure provide for a memory programming technique having lower sneak path currents. In one or more embodiments, a program supply voltage is directed to a selected wordline (or local wordline), rather than a selected bitline. The selected bitline can be driven to zero volts to cause a potential difference of the program voltage across a selected memory cell. Unselected bitlines can be driven to an intermediate voltage. As a result, a program supply current leaks in cells connected to the selected wordline (or local wordline), and not on unselected wordlines. The intermediate supply (e.g., two volts) can leak through unselected cells located on the selected bitline. In the case of a 5 uA sneak current, total leak current to an unselected cell in the selected row would be 5 uA*(number of bitlines−1), which is about 35 uA. This is a far lower leaker magnitude than the 2.5 mA of the example above, significantly reducing current supply requirements and power consumption. Moreover, because the sneak current magnitude is independent of a number of rows, this program approach enables larger numbers of rows without significant impact to supply voltage requirements.

In addition, one or more embodiments provides for a memory architecture having low current consumption associated with programming one or more two-terminal memory cells. Generally, a memory block will have a large number of bitlines and wordlines, and sneak path currents at various nodes of the memory block lead to increases in supply current requirements. Some architectures may have a fewer number of bitlines than wordlines, yet by programming from the bitline, a large number of leak path nodes exists for each of a large number of wordlines. Accordingly, in one or more embodiments is disclosed a memory architecture having far fewer leak path nodes, thereby significantly reducing the program current requirements. For instance, a sub-block of memory can have relatively few bitlines (e.g., 100 or fewer, 50 or fewer, 10 or fewer, 8 or fewer, and so on) compared with a number of wordlines (e.g., 512, and so on). Furthermore, by driving programming of memory cells from a non-global wordline (e.g., a local wordline traversing a less than all sub-blocks of a block of memory), the number of leak path points can be reduced, thereby reducing current requirements in conjunction with programming a memory cell on the non-global wordline.

Referring now to the drawings, FIG. 1 illustrates a schematic diagram of an example memory array 100 and low sneak current program technique, according to various embodiments of the subject disclosure. Memory array 100 can comprise a set of local wordlines 102 connected to a second of two terminals of respective groups of two-terminal memory cells. Additionally, memory array 100 can comprise a set of bitlines 104 connected to a first of the two terminals of respective subsets of two-terminal memory cells. In some embodiments, as depicted by FIG. 1, the groups of two-terminal memory cells can be arranged into rows positioned along respective local wordlines 102, whereas the subsets of two-terminal memory cells can be arranged into columns positioned along respective bitlines 104. In such embodiments, local wordlines 102 intersect the bitlines 104, and at respective such intersections is a two-terminal memory cell. However, other embodiments can be employed having other configurations of groups or subsets of memory cells positioned on another suitable arrangement of bitlines, local wordlines, or the like (e.g., global wordlines, data lines, source lines, and so on). Thus, memory array 100 is not limited to the embodiments depicted, but other embodiments that would be appreciated by those of skill in the art are considered within the scope of the subject disclosure.

Figure 2:
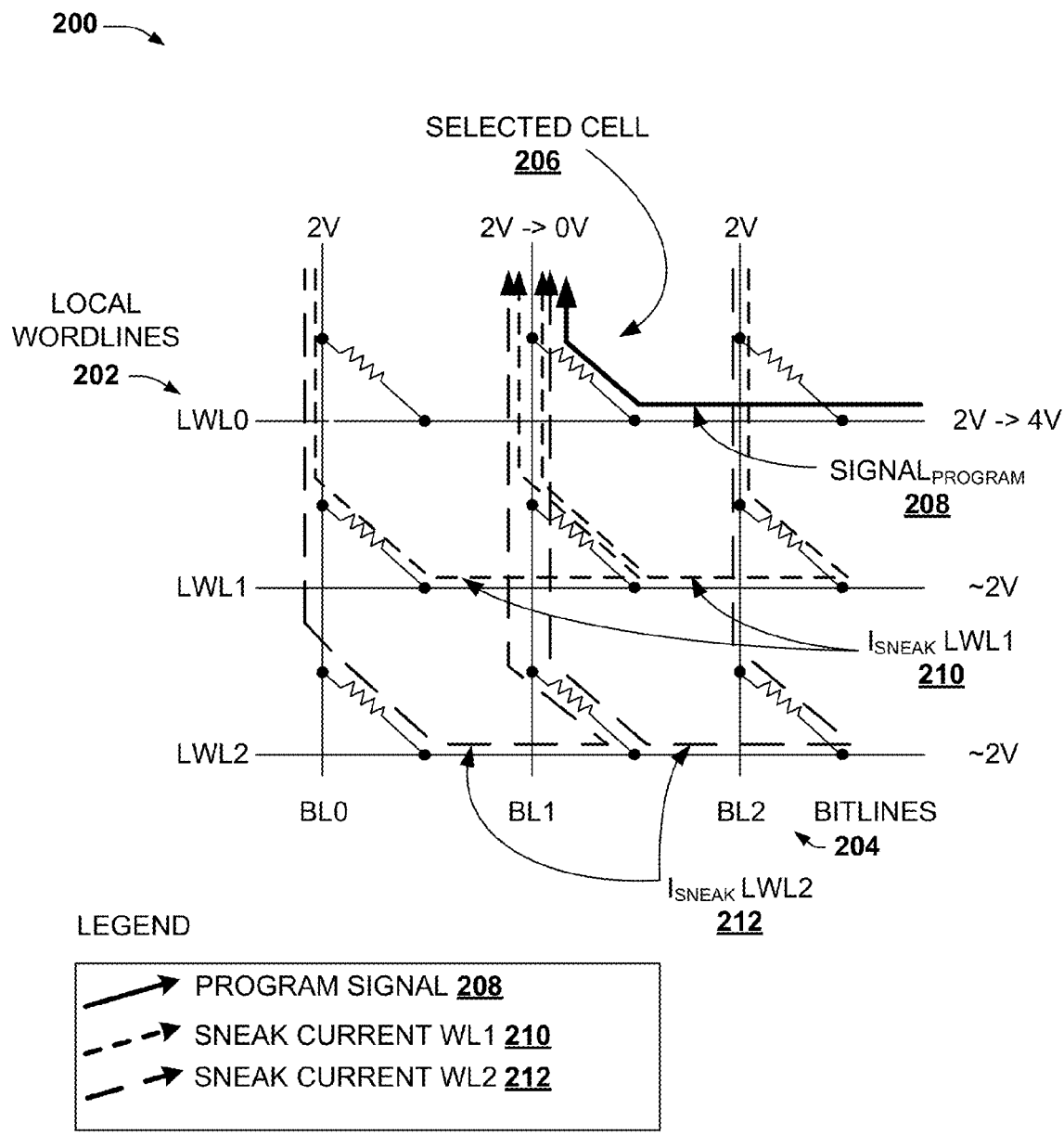
FIG. 2 illustrates a schematic diagram of a sample two-terminal memory array and sneak path currents in response to a programming operation, in some aspects.

Memory array 100 illustrates three local wordlines 102, including local wordlines $LWL_0$, $LWL_1$, and $LWL_2$. Three bitlines 104 are depicted as well, including $BL_0$, $BL_1$, and $BL_2$. FIG. 1 illustrates a memory operation implemented for a selected cell 106, located at an intersection of local wordline $LWL_0$ and bitline $BL_1$ (shaded in gray). In this case, the memory operation is a program operation targeting selected cell 106. To mitigate a number of sneak paths caused by the program operation, a program signal 108 is supplied to the local wordline 102 associated with selected cell 106. Further, the bitline 104 associated with selected cell 106 is driven to zero volts while other bitlines are maintained at an intermediate voltage, resulting in a potential difference approximately equal to the program voltage across selected cell 106 (representing by the dark bold line and arrow through selected cell 106). In terms of sneak path currents, program signal 108 causes a lesser potential difference (e.g., program voltage−the intermediate voltage) through other memory cells on local wordline $LWL_0$, resulting in a non-program signal (light, non-bolded lines) through other memory cells on local wordline $LWL_0$ (e.g., memory cells in the upper left (110) and upper right (112) of memory array 100). FIG. 2, infra, provides more detail as to sneak path currents associated with the program technique depicted by FIG. 1.

Figure 3:
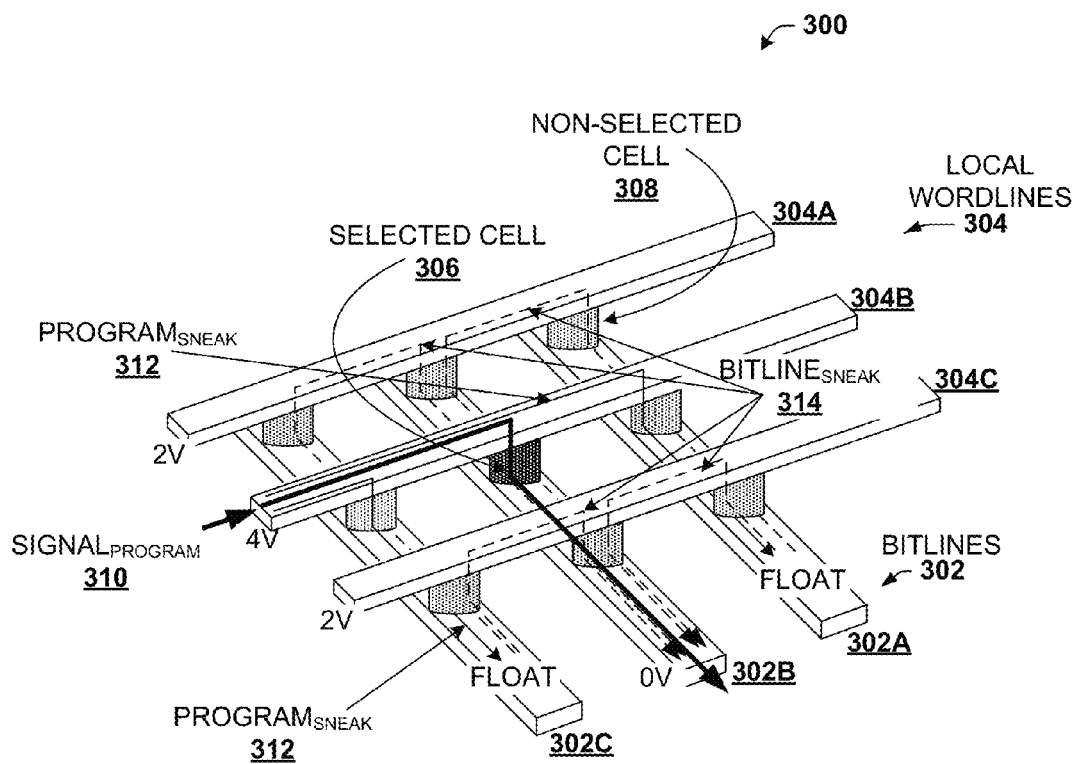
FIG. 3 depicts a block diagram of an example crossbar memory array and a low sneak path programming operation according to other aspects.

FIGS. 2 and 3 depict respective diagrams of sneak path currents that can occur in a crossbar-based two-terminal memory architecture, in response to the programming technique of FIG. 1, supra. For FIG. 2, non-program bitlines are depicted as driven at 2 volts, whereas in FIG. 3 non-program bitlines are depicted as floating for the programming technique. It should be understood that these non-program bitline configurations are exemplary only; the non-program bitline configurations can be interchanged, where suitable, or another suitable voltage magnitude (e.g., 2.5 volts, 3 volts, 1 volt, 1.5 volts, and so forth) can be selected instead for the non-program bitline configurations. Also, for sake of clarity, sneak path currents resulting from program current supply signals are depicted in FIG. 3, but not in FIG. 2, thought it should be understood that these sneak path currents can exist on $LWL_0$ and bitlines $BL_0$ and $BL_2$ of FIG. 2 as is depicted in corresponding bitlines of FIG. 3.

Referring first to FIG. 2, there is depicted a schematic diagram of an example memory array 200 illustrating sneak path currents that result from inter-bitline potentials occurring in response to one or more disclosed programming techniques. In some embodiments, memory array 200 can be substantially similar to memory array 100 of FIG. 1, though the subject disclosure is not so limited. Memory array 200 can comprise a set of local wordlines 202 intersecting a set of bitlines 204. At respective intersections of local wordlines 202 and bitlines 204 is a two-terminal memory cell. These two-terminal memory cells can comprise resistive memory cells, in some embodiments (e.g., resistive-switching memory cells, resistive random access memory cells, and so forth). In other embodiments, the two-terminal memory cells can comprise ferroelectric memory, magneto-resistive memory, organic memory, phase change memory, conductive bridging memory, as well as other suitable two-terminal memory structures.

Memory array 200 comprises a selected cell 206 targeted for a program operation. The program operation involves a pre-charge phase and a program phase. In at least one embodiment of the subject disclosure, during the pre-charge phase each of bitlines 204 and local wordlines 202 can be connected to a supply voltage of about two volts (in other embodiments, other signals or signal magnitudes can be employed for the pre-charge). For the program phase, wordline $LWL_0$ is driven to about four volts, and bitline $BL_1$ is driven to about zero volts. This generates a program signal 208 having a magnitude of about four volts through selected cell 206, as depicted. Though not depicted at FIG. 2, a non-program signal can be produced in other cells on $LWL_0$ (e.g., see FIG. 1, supra and FIG. 3, infra).

Further to the above, the program operation results in a potential difference of two volts between bitline $BL_1$ and bitlines $BL_0$ and $BL_2$. Moreover, each of local wordlines $LWL_1$ and $LWL_2$ provides a possible sneak path for this potential difference. Accordingly, memory array 200 comprises a sneak path on $LWL_1$, $I_{SNEAK}$ $LWL_1$ 210 (small dashed lines), and a sneak path on $LWL_2$, $I_{SNEAK}$ $LWL_2$ 212 (large dashed lines). These sneak path currents produce currents on $BL_1$, which can reduce sensing margin with respect to program signal 208 (see also, FIG. 3, infra). However, a combined magnitude of sneak path current can be reduced substantially for a sub-block of memory cells, having many local wordlines, but far fewer bitlines intersecting respective local wordlines. For instance, the total magnitude of sneak path current per selected bitline can be reduced from $I_{SNEAK}$*(number of local wordlines−1) to $I_{SNEAK}$*(number of bitlines−1). To quantify the reduction in magnitude, take the case of sneak path current $I_{SNEAK}$=5 uA, for a memory array comprising 512 local wordlines and 8 bitlines intersecting the 512 local wordlines. The sneak current magnitude can be reduced from 5 uA*511 or about 2.5 mA, to 5 uA*7 or about 35 uA. This reduces the magnitude of sneak path current on the selected bitline by 511/7, or a factor of 73. This factor will vary for differing numbers of bitlines and wordlines, but in general, the significant reduction in sneak path current can facilitate larger blocks of memory, increasing memory density, efficiency, and improving die sizes for semiconductor memory devices.

FIG. 3 depicts a block diagram of an example crossbar memory array 300. Crossbar memory array 300 can be substantially similar to memory arrays 100, 200, depicted schematically in FIGS. 1 and 2, respectively, infra, though the subject disclosure is not so limited. In some disclosed embodiments, memory array 300 can have one or more different characteristics from memory arrays 100, 200, however, as is described in more detail below. Further, memory array 300 illustrates sneak path currents caused by a program current supply signal applied to a selected local wordline, in addition to sneak path currents caused by inter-bitline voltage potentials. Moreover, memory array 300 depicts an example program operation in which non-selected bitlines are allowed to float instead of being driven to a selected voltage.

Memory array 300 can comprise a set of bitlines 302 substantially perpendicular to a set of wordlines 304. Where respective bitlines 302A, 302B, 302C intersect one of the wordlines 304A, 304B, 304C, a resistive-switching memory cell is positioned. Further, a selected cell 306 is targeted for a program operation. Although FIG. 3 illustrates an example of suitable signals for a program phase, it is to be appreciated that one or more pre-charge phases can be implemented for the program operation (e.g., see FIGS. 6 and 7, infra). Particularly, the program phase includes a program signal 310 of about four volts applied to local wordline 304B, and intermediate signals of about two volts applied to local wordlines 304A, 304C. Additionally, bitline 302B is driven to zero volts, whereas bitlines 302A, 302C are left floating. Capacitive coupling among bitlines 302A, 302C and wordlines 304 will induce a voltage onto bitlines 302A, 302C greater than zero volts and less than four volts.

The program phase voltages can cause multiple sneak path currents, sneak paths caused by signal program 310, referred to as program sneak currents 312, and sneak paths caused by potential differences in floating bitlines and bitline 302B, referred to as bitline sneak currents 314. Bitline sneak currents 312 are depicted by dashed lines, whereas the program sneak currents 312 are depicted by narrow solid lines (note that for clarity program sneak currents 312 are depicted in memory array 300 but not for memory array 200 of FIG. 2, supra, though it should be understood that similar program sneak currents could exist on $LWL_0$ of FIG. 2 similar to that depicted by program sneak currents 312 of memory array 300). Four paths are depicted for bitline sneak currents 314, through non-selected cells 308 on wordlines 304A, 304C. Each of the bitline sneak currents 314 share bitline 302B as a common component of the respective paths. Program sneak currents 312 propagate through the selected local wordline 304B, to bitlines 302A, 302C, respectively.

It is worth noting the lack of program supply current sneak paths on local wordlines other than on the selected local wordline 304B of memory array 300 and $LWL_0$ of memory array 200. With respect to FIG. 2, this phenomenon occurs because of the 2 volt source applied to non-selected wordlines of FIG. 2. With respect to FIG. 3, this occurs because the non-selected wordlines 302A, 302C are allowed to float, and capacitive coupling induces a voltage on non-selected wordlines 302A, 302C which can approach 2 volts in some embodiments (e.g., depending on inter-wordline capacitance). Sneak paths that might occur on these non-selected wordlines can be regarded as having only small impact on sensing margins.

Figure 4:
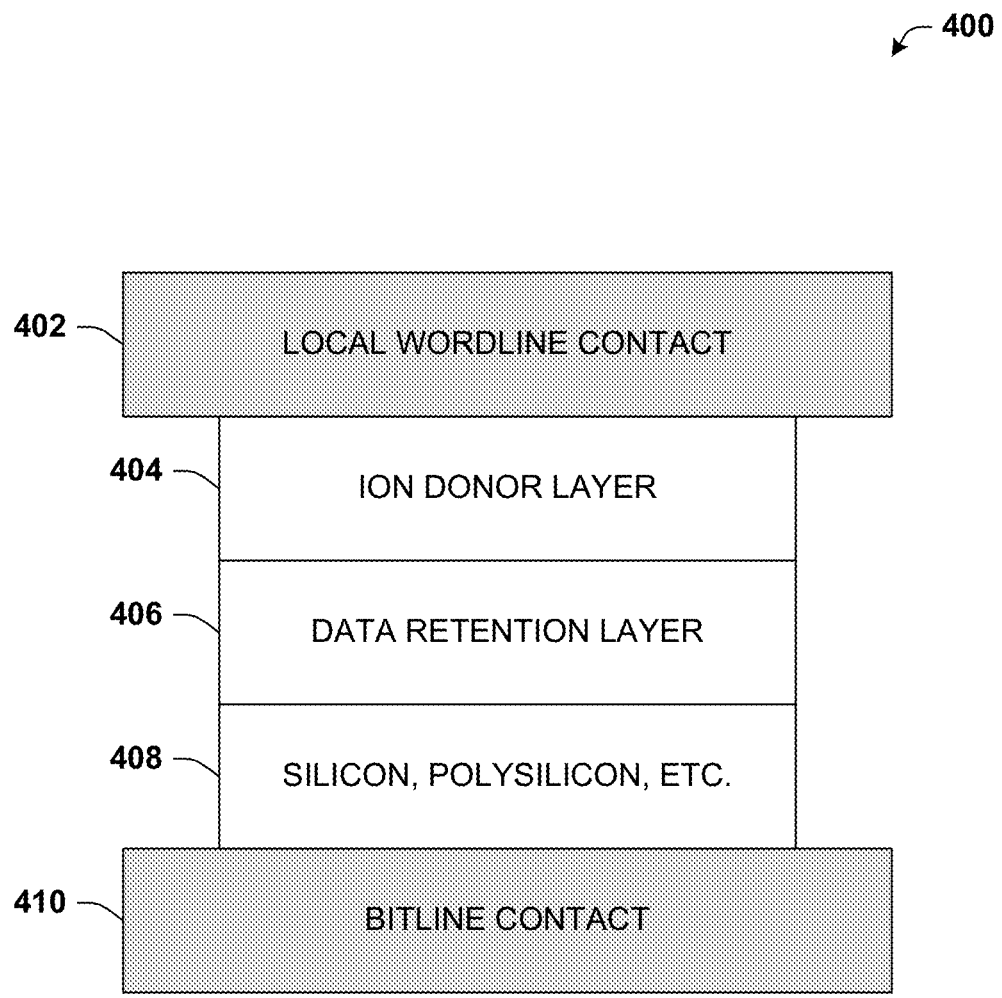
FIG. 4 illustrates a block diagram of an example two-terminal memory cell configured for low sneak path programming according to additional embodiments.

FIG. 4 depicts a block diagram of an example memory cell 400 configured for programming according to a low sneak path current programming technique, according to one or more additional embodiments of the subject disclosure. Memory cell 400 can comprise a local wordline contact 402. In one embodiment, local wordline contact 402 can comprise a segment of a wire or conductive entity serving as the local wordline itself. In other embodiments, local wordline contact 402 can comprise a suitable conductive material interfacing the wire or conductive entity serving as the local wordline to memory cell 400.

Adjacent to local wordline contact 402 can be an ion donor layer 404. Ion donor layer 404 can comprise a suitable metal in some embodiments. Examples can include Ag, Au, Ti, Ni, Al, Cr, Ta, Fe, Mn, W, V, Co, Pt, Pd, or the like, or a suitable combination thereof. Ion donor layer 404 can comprise free ions that can be displaced in response to a suitable electric signal (e.g., a potential difference). Particularly, a positive voltage applied at local wordline contact 402 can cause free ions from ion donor layer 404 to migrate into a data retention layer(s) 406, adjacent to ion donor layer 404. Data retention layer 406 can be an electrically resistive material that is relatively amorphous. Accordingly, data retention layer 406 can accept migrating free ions from ion donor layer 404, which can form a programmable conductive filament within data retention layer 406 having multiple stable resistance states for storing digital information. In one embodiment, data retention layer 406 can comprise a single material or layer, and in other embodiments, data retention layer 406 can comprise multiple layered materials. In other embodiments, data retention layer 406 may be a phase change layer, or the like.

Further, adjacent to data retention layer 406 includes a conductive contact layer 408. Conductive contact layer 408 can comprise a silicon containing layer, doped polysilicon, doped silicon germanium layer, or the like. In some embodiments, conductive contact layer 408 can be doped to a desired conductivity value. Further, conductive contact layer 408 can be adjacent to a bitline contact 410, which can be a segment of a wire or conductive entity that serves as a bitline of a memory array, or can be a suitable interface between conductive contact layer 408 and the bitline.

As mentioned above, in some embodiments, a barrier layer material may be disposed between data retention layer 406 and conductive contact layer 408 to reduce undesired contaminants, e.g. oxygen, from being in data retention layer 406. Additionally, in some embodiments, a tunneling barrier layer material may be disposed between data retention layer 406 and conductive contact layer 408 to create a switching voltage barrier.

Memory cell 400 is configured to be operable in conjunction with low sneak path programming techniques disclosed herein. Particularly, in some embodiments, ion donor layer 404 is positioned adjacent to local wordline contact 402. In response to a positive program voltage applied to local wordline contact 402, free ions from ion donor layer 404 can migrate into data retention layer 406. Further, a negative voltage applied at local wordline contact 402 can partially retract a conductive filament formed in data retention layer 406, causing memory cell 400 to have a high resistance state. A suitable positive voltage can reform the conductive filament and return memory cell 400 to a low resistance state. Accordingly, memory 400 can be configured to operate in conjunction with a program or erase signal applied at local wordline contact 402 (e.g., in contrast to the program or erase signal applied at bitline contact 410).

Figure 5:
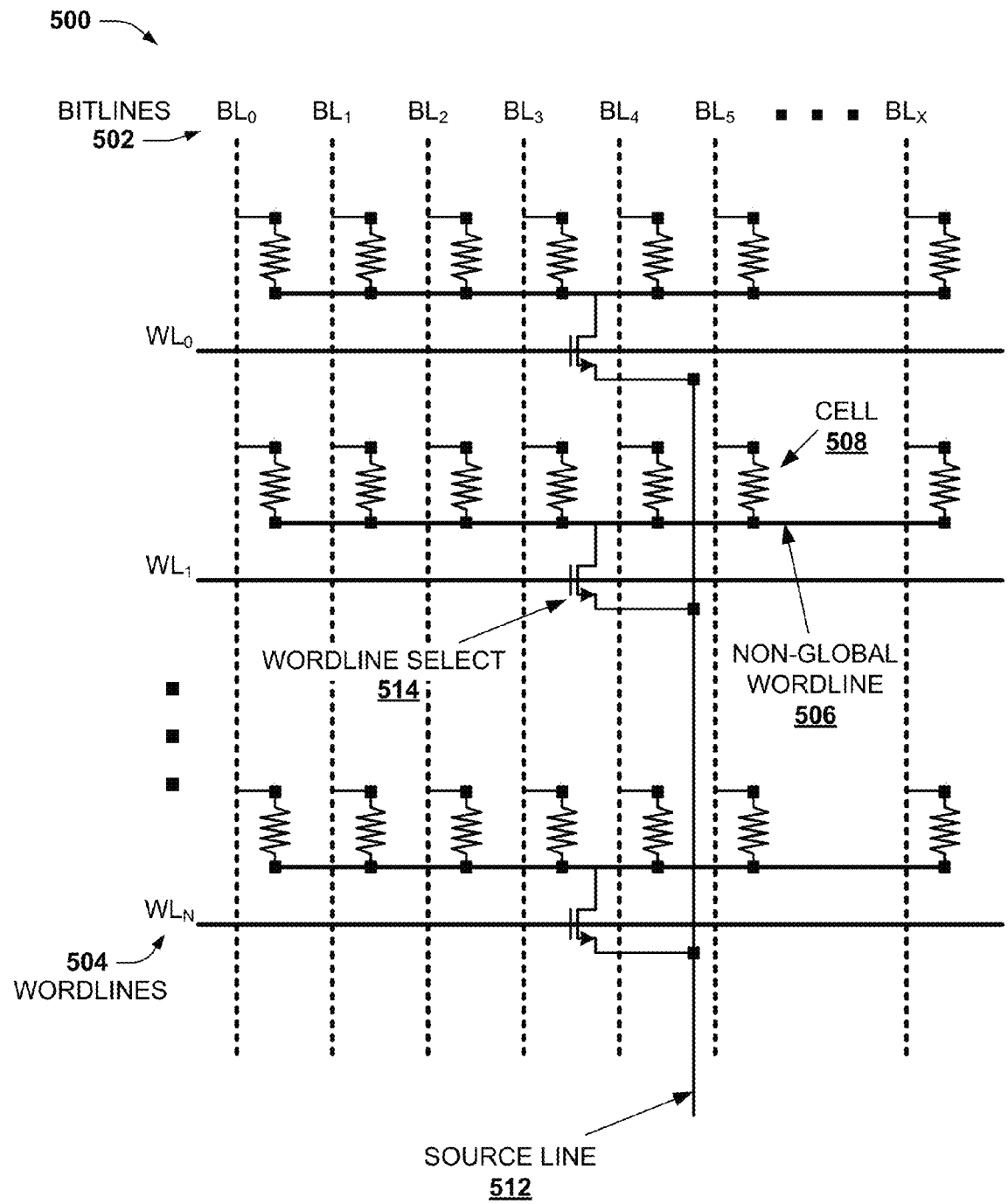
FIG. 5 illustrates a schematic diagram of an example memory sub-block configured for low sneak path programming, in an embodiment(s).

FIG. 5 illustrates a schematic diagram of an example memory sub-block 500 according to additional aspects of the subject disclosure. Memory sub-block can comprise a set of bitlines 502, including bitlines $BL_0$, $BL_1$, $BL_2$, $BL_3$, $BL_4$, $BL_5$, . . . , $BL_X$, where X is a suitable positive integer. In at least one embodiment of the subject disclosure, X can be equal to 8; however, in other embodiments other values of X can be implemented.

Intersecting bitlines 502 are a set of wordlines 504. Wordlines 504 can include wordlines $WL_0$, $WL_1$, . . . , $WL_N$ (where N is a suitable positive integer, e.g., 512), which can be global wordlines in some embodiments. A global wordline (as opposed to a local wordline) can traverse multiple memory sub-blocks 500, and is not exclusive to memory sub-block 500. Additionally, memory sub-block 500 includes a set of non-global wordlines, including non-global wordline 506 (e.g., a local wordline). Contrary to wordlines 504, non-global wordlines are exclusive to memory sub-block 500. Accordingly, multiple memory sub-blocks according to memory sub-block 500 will have respective sets of non-global wordlines, exclusive to those respective memory sub-blocks.

Memory sub-block 500 is arranged with respect to an array of two-terminal memory cells 508. As depicted, respective bitlines 502 are connected to respective first terminals of two-terminal memory cells 508 in a given column of two-terminal memory cells 508. Respective non-global wordlines 506 are connected to respective second terminals of two-terminal memory cells 508 in a given row of two-terminal memory cells 508. Thus, a particular memory cell 508 is addressed by selecting one of bitlines 502 and one of non-global wordlines 506.

Wordlines 504 control a set of wordline select transistors 514. In at least one embodiment, wordline select transistors 514 can be gate-based semiconductor transistors (e.g., field effect transistor, floating gate transistor, multi-gate transistor, and so on), having respective gate terminals connected to and controlled by respective ones of wordlines 504. Thus, respective wordline select transistors 514 are configured to selectively activate or deactivate respective ones of wordline select transistors 514, which in turn selectively connects or disconnects associated respective ones of non-global wordlines 506 with a source line 512.

As an example of a program operation can be described as follows. A memory cell 508 can be activated by activating $BL_5$ and activating $WL_1$. Other ones of bitlines 502 and wordlines 504 can be left deactivated. In response to activating $WL_1$, an associated wordline select transistor 514 connects a non-global wordline 506 associated with memory cell 508 to source line 512. By applying a suitable program voltage to source line 512, and driving bitline $BL_5$ to zero volts, memory cell 508 can observe a potential difference approximately equal to the program voltage. In at least one embodiment, memory cell 508 can be substantially similar to memory cell 400, of FIG. 4. Accordingly, applying the program voltage from source line 512 can serve to program memory cell 508. Erasing memory cell 508 can be accomplished by applying a negative voltage at source line 512, or suitable positive erase voltage depending on characteristics of memory cell 508.

With the memory sub-block 500 as depicted by FIG. 5, sneak path currents resulting from programming memory cell 508 can be substantially reduced as compared with programming memory cell 508 from a bitline. This can result at least in part from a relatively small number of bitlines 502 associated with memory sub-block 500 as compared to a number of wordlines 504 of memory sub-block 500, and fact that non-global wordlines 506 are exclusive to memory sub-block 500 (e.g., are not connected to other bitlines on other sub-blocks—see FIG. 6, infra). Moreover, non-selected non-global wordlines 506 can be driven, or allowed to float, to a voltage substantially similar to that of non-selected bitlines 502. This can mitigate or avoid sneak path currents between the non-selected non-global wordlines 506 and non-selected bitlines 502.

Figure 6:
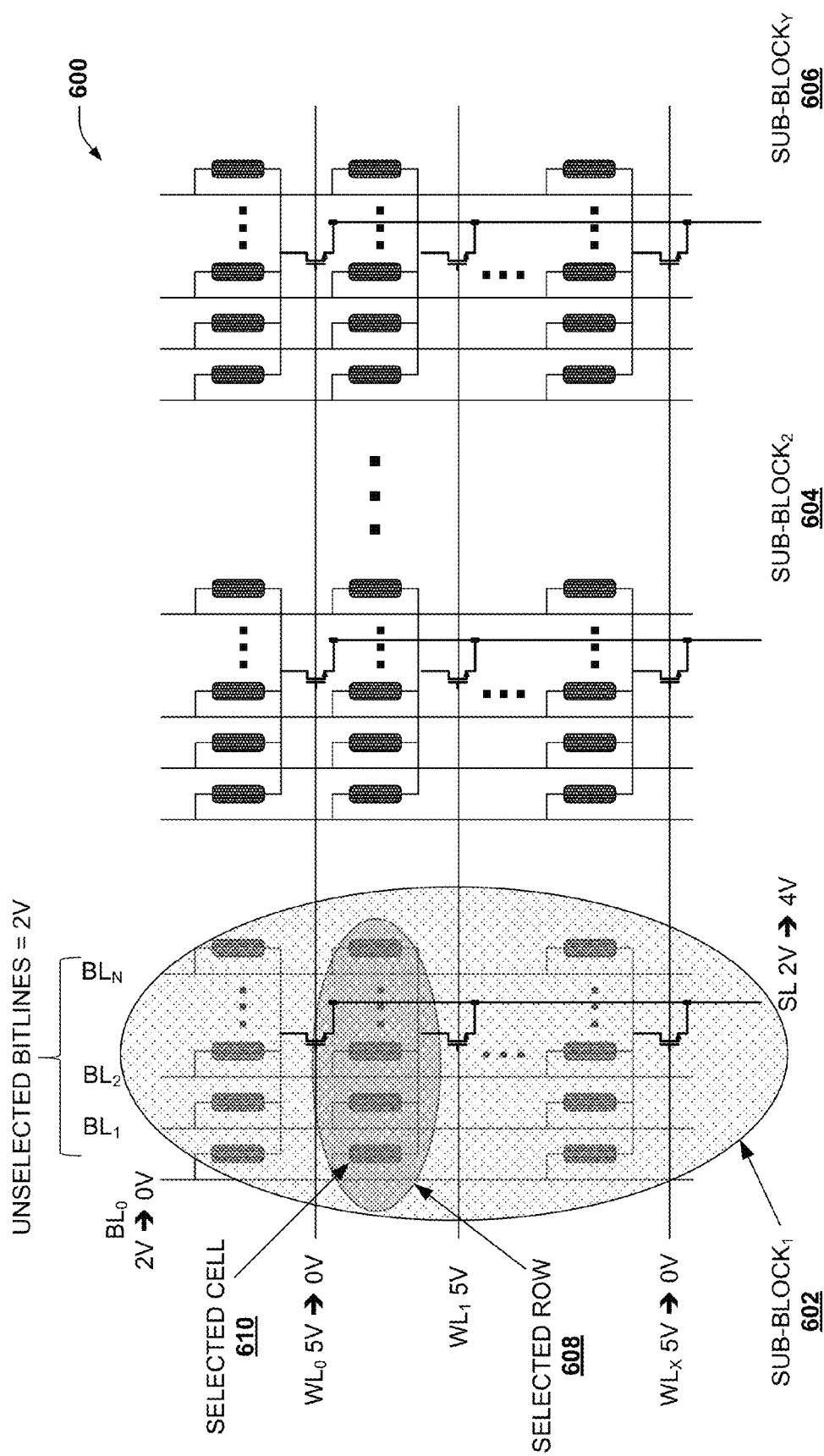
FIG. 6 depicts a schematic diagram of an example programming operation for one or more sub-blocks of memory, in other embodiments.

Referring now to FIG. 6, there is depicted a block of memory 600 and a program operation configured to mitigate sneak path current within block of memory 600 according to alternative or additional embodiments disclosed herein. Block of memory 600 can comprise multiple sub-blocks, including sub-block$_1$ 602, sub-block$_2$ 604 and sub-block$_Y$ 606, where Y is a suitable positive integer.

A program operation is depicted for a selected memory sub-block$_1$ 602, depicted by the lightly shaded oval. A selected row 608 of memory sub-block$_1$ 602 is indicated by a horizontal, darkly shaded oval, and a selected cell 610 within selected row 604 is a memory cell connected to $BL_0$ of memory sub-block$_1$ 602.

Figure 7:
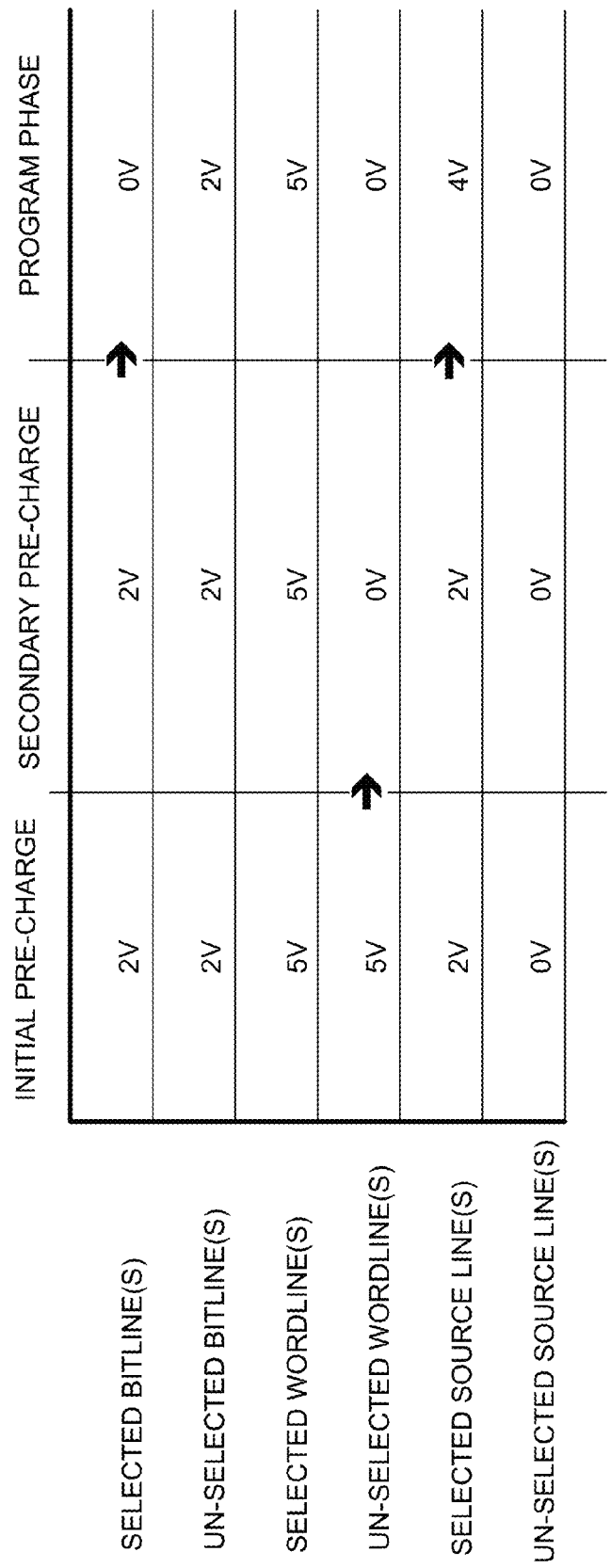
FIG. 7 illustrates a diagram of an example memory operation chart for a program operation, according to further embodiments.

FIG. 7 depicts a diagram of an example programming procedure 700 for implementing in conjunction with memory block 600. Programming procedure 700 is separated into three stages, including a program phase, initial pre-charge phase and secondary pre-charge phase. It should be appreciated that initial pre-charge phase and secondary pre-charge phase can be referred to as a single pre-charge phase, however, with an in-phase transition.

Dark arrows within programming procedure 700 indicate changes in a signal between respective phases of programming procedure 700. At the initial pre-charge phase, selected bitline $BL_0$ of memory sub-block 602 is powered to 2 volts, and likewise non-selected bitlines $BL_1$-$BL_N$ are powered by 2 volts. A selected wordline, $WL_1$, is powered to five volts, and un-selected wordlines, $WL_0$, $WL_X$, are powered to five volts. A selected source line (within sub-block$_1$ 602) is powered at 2 volts, and un-selected source lines (of sub-block$_2$ 604 through sub-block$_Y$ 606) are powered at zero volts or left floating. For the secondary pre-charge phase, voltage at un-selected wordlines $WL_0$, $WL_X$ is driven from 5 volts to 0 volts. This deactivates wordline select transistors associated with non-selected rows of memory sub-block$_1$ 602, electrically disconnecting the non-selected rows from the source line of memory sub-block$_1$ 602. After the secondary pre-charge phase, memory cells on selected row 608 are ready for programming with reduced sneak path currents (e.g., through memory cells on the selected bitline and the selected row 608). For the program phase, the selected bitline $BL_0$ is driven from two volts to about zero volts, and the selected source line is driven from two volts to four volts. This results in a four volt differential across the selected memory cell 610, programming the selected memory cell 610.

The aforementioned diagrams have been described with respect to interaction between several components of a memory cell, or memory architectures comprised of such memory cells. It should be appreciated that in some suitable alternative aspects of the subject disclosure, such diagrams can include those components and architectures specified therein, some of the specified components/architectures, or additional components/architectures. Sub-components can also be implemented as electrically connected to other sub-components rather than included within a parent architecture. Additionally, the voltages illustrated may be changed, depending upon specific memory cell requirements or design. Further, it is noted that one or more disclosed processes can be combined into a single process providing aggregate functionality. For instance, a program or erase process can comprise a block program, block erase, page erase, or the like, to program or erase a plurality of memory cells by way of an aggregate process. Components of the disclosed architectures can also interact with one or more other components not specifically described herein but known by those of skill in the art.

Figure 8:
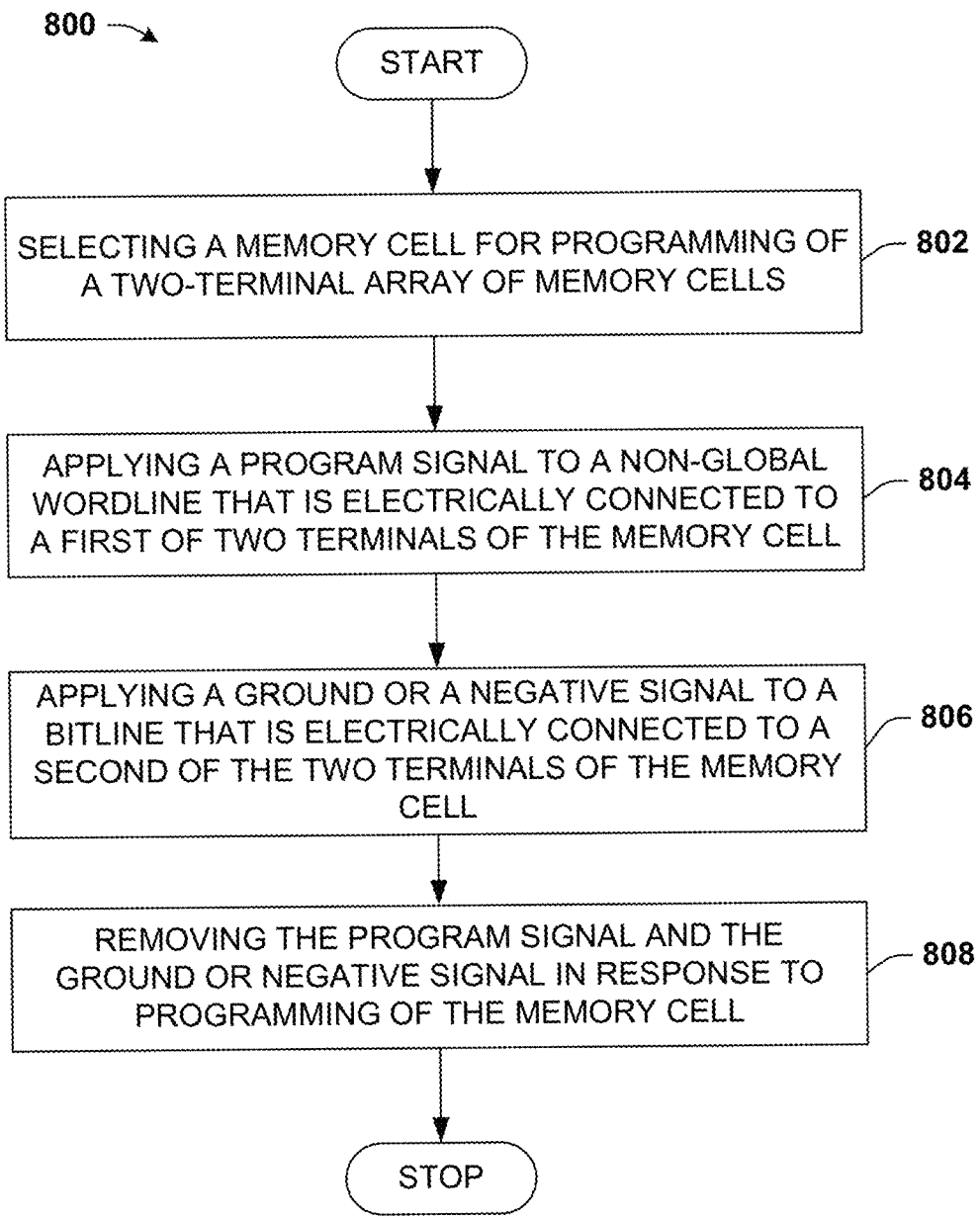
FIG. 8 depicts a flowchart of a sample method for programming two-terminal memory in further embodiments of the subject disclosure.
Figure 9:
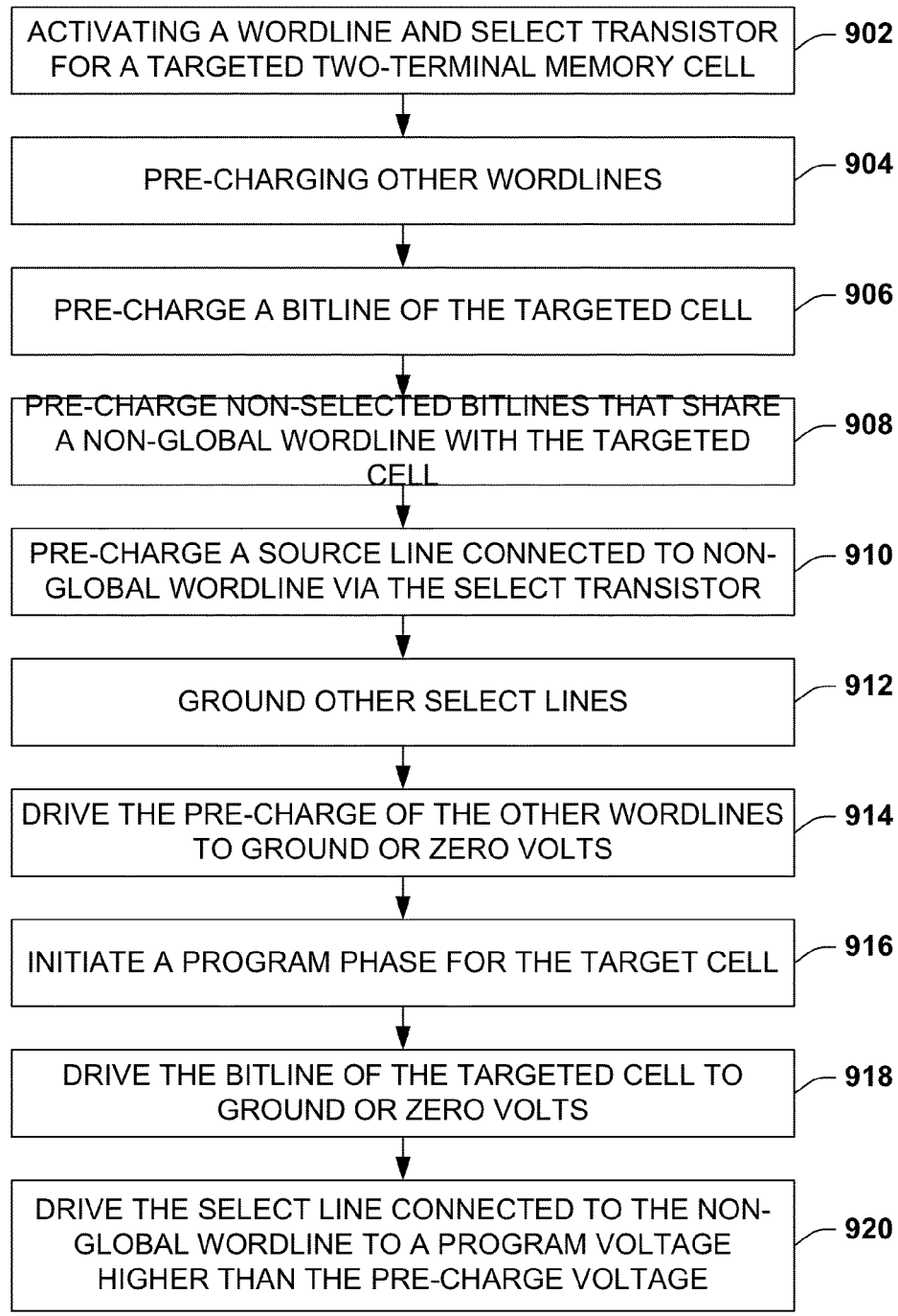
FIG. 9 illustrates a flowchart of an example method for reducing sneak path current in response to programming a two-terminal memory cell in an aspect(s).

In view of the exemplary diagrams described supra, process methods that can be implemented in accordance with the disclosed subject matter will be better appreciated with reference to the flow charts of FIGS. 8 and 9. While for purposes of simplicity of explanation, the methods of FIGS. 8 and 9 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any suitable computer-readable device, device in conjunction with a carrier, storage medium, or the like, or a suitable combination thereof.

FIG. 8 illustrates a flowchart of a sample method 800 according to one or more additional aspects of the subject disclosure. Method 800 can comprise, at 802, selecting a memory cell for programming in an array of two-terminal memory cells. At 804, method 800 can comprise applying a program signal to a non-global wordline that is electrically connected to a first of two terminals of the memory cell. At 806, method 800 can comprise applying a ground or negative signal to a bitline that is electrically connected to a second of the two terminals of the memory cell.

In additional embodiments, method 800 can further comprise floating a second non-global wordline of the memory array, adjacent to the non-global wordline. In an alternative embodiment, method 800 can comprise applying a non-program signal to the second non-global wordline. In another embodiment, method 800 can comprise applying a non-program signal to a second bitline of the memory array that is near to the bitline (e.g., adjacent to the bitline). In at least one embodiment, applying the program signal to the non-global wordline can further comprise applying about four volts to the non-global wordline.

In additional embodiments, method 800 can comprise applying about two volts to one or more additional non-global wordlines near to the non-global wordline. Further, method 800 can comprise applying about two volts to one or more bitlines near to the bitline, in such embodiments.

According to further embodiments, applying the program signal to the non-global wordline further comprises activating a global wordline that selectively connects, when activated, the non-global wordline to a source line. Moreover, the further embodiments can comprise deactivating other global wordlines that selectively disconnect, when deactivated, other non-global wordlines of the memory array from the source line. In addition, the further embodiments can comprise applying the program signal to the source line. In various embodiments, the two-terminal memory cells can comprise memory cells in which the first terminal of the two terminals is an ion donor layer. Moreover, the two-terminal memory cells can comprise memory cells in which the second terminal of the two terminals of the memory cell is a silicon, or polysilicon material.

FIG. 9 illustrates a flowchart of a sample method 900 for mitigating sneak path current in conjunction with a programming operation for a memory array, according to one or more additional embodiments of the subject disclosure. At 902, method 900 can comprise activating a wordline and select transistor for a targeted two-terminal memory cell. At 904, method 900 can comprise pre-charging other wordlines of the memory array. At 906, method 900 can comprise pre-charging a bitline of the targeted two-terminal memory cell. At 908, method 900 can comprise pre-charging non-selected bitlines that share a non-global wordline with the targeted two-terminal memory cell.

At 910, method 900 can comprise pre-charging a source line connected to non-global wordline via the select transistor. At 912, method 900 can comprise grounding other source lines of the memory array. At 914, method 900 can comprise driving the pre-charge of the other wordlines to ground, or zero volts.

At 916, method 900 can comprise initiating a program phase for the targeted two-terminal memory cell. At 918, method 900 can comprise driving the bitline of the targeted two-terminal memory cell to ground, or zero volts. At 920, method 900 can comprise driving the source line connected to the non-global wordline to a program voltage higher than the pre-charge voltage. According to various embodiments, the memory array for which the programming operation is applied can be selected to have a fewer number of bitlines within a sub-block of the memory array than a corresponding number of global wordlines. Various respective numbers of bitlines and global wordlines can be employed which meet this criterion, according to these embodiments. For instance, there may be about half as many bitlines as global wordlines in the sub-block, about one quarter as many bitlines as global wordlines, about one tenth as many bitlines as global wordlines, although the subject disclosure is not limited to integral fractions between the number of bitlines and the number of global wordlines. In some aspects, the number of bitlines and global wordlines can at least in part be related to a size of the sub-block in terms of logical bits. As one illustrative example embodiment having sub-blocks of 4 kilobit or 4 kilobyte size could have 512 global wordlines and 8 bitlines per sub-block. Other examples can be implemented as well.

Figure 10:
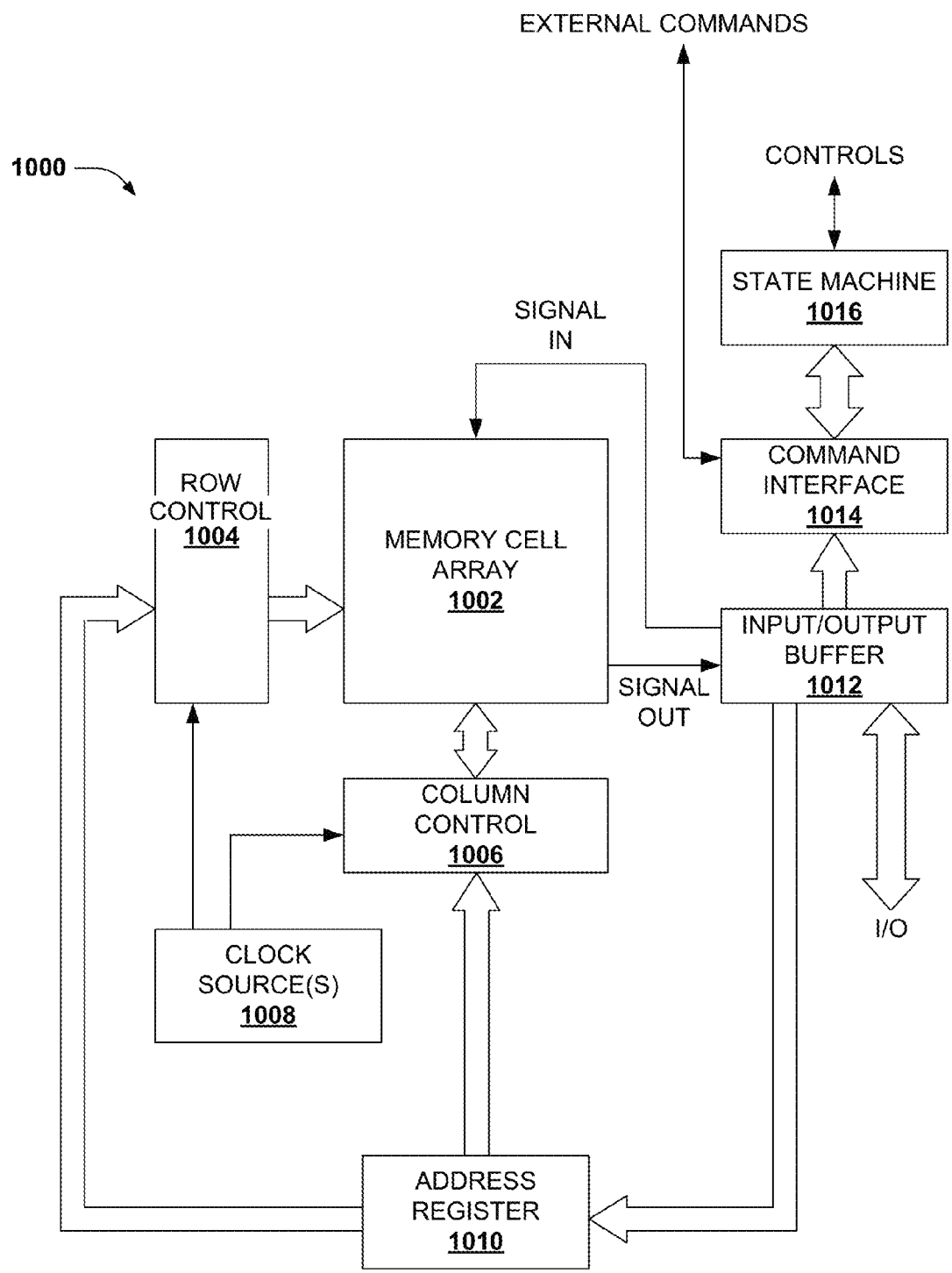
FIG. 10 depicts a block diagram of an example operating environment for a memory array according to one or more embodiments.

In order to provide a context for the various aspects of the disclosed subject matter, FIG. 10, as well as the following discussion, is intended to provide a brief, general description of a suitable environment in which various aspects of the disclosed subject matter can be implemented or processed. While the subject matter has been described above in the general context of semiconductor architectures and process methods for fabricating or operating such architectures, those skilled in the art will recognize that the subject disclosure also can be implemented in combination with other architectures or process methods. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

FIG. 10 illustrates a block diagram of an example operating and control environment 1000 for a memory cell array 1002 according to aspects of the subject disclosure. In at least one aspect of the subject disclosure, memory cell array 1002 can comprise a variety of memory cell technology. Particularly, memory cell array 1002 can comprise two-terminal memory such as resistive-switching memory cells, as described herein.

A column controller 1006 can be formed adjacent to memory cell array 1002. Moreover, column controller 1006 can be electrically coupled with bit lines of memory cell array 1002. Column controller 1006 can control respective bitlines, applying suitable program, erase or read voltages to selected bitlines.

In addition, operating and control environment 1000 can comprise a row controller 1004. Row controller 1004 can be formed adjacent to column controller 1006, and electrically connected with word lines of memory cell array 1002. Row controller 1004 can select particular rows of memory cells with a suitable selection voltage. Moreover, row controller 1004 can facilitate program, erase or read operations by applying suitable voltages at selected word lines.

A clock source(s) 1008 can provide respective clock pulses to facilitate timing for read, write, and program operations of row control 1004 and column control 1006. Clock source(s) 1008 can further facilitate selection of word lines or bit lines in response to external or internal commands received by operating and control environment 1000. An input/output buffer 1012 can be connected to an external host apparatus, such as a computer or other processing device (not depicted) by way of an I/O buffer or other I/O communication interface. Input/output buffer 1012 can be configured to receive write data, receive an erase instruction, output readout data, and receive address data and command data, as well as address data for respective instructions. Address data can be transferred to row controller 1004 and column controller 1006 by an address register 1010. In addition, input data is transmitted to memory cell array 1002 via signal input lines, and output data is received from memory cell array 1002 via signal output lines. Input data can be received from the host apparatus, and output data can be delivered to the host apparatus via the I/O buffer.

Commands received from the host apparatus can be provided to a command interface 1014. Command interface 1014 can be configured to receive external control signals from the host apparatus, and determine whether data input to the input/output buffer 1012 is write data, a command, or an address. Input commands can be transferred to a state machine 1016.

State machine 1016 can be configured to manage programming and reprogramming of memory cell array 1002. State machine 1016 receives commands from the host apparatus via input/output interface 1012 and command interface 1014, and manages read, write, erase, data input, data output, and like functionality associated with memory cell array 1002. In some aspects, state machine 1016 can send and receive acknowledgments and negative acknowledgments regarding successful receipt or execution of various commands.

To implement read, write, erase, input, output, etc., functionality, state machine 1016 can control clock source(s) 1008. Control of clock source(s) 1008 can cause output pulses configured to facilitate row controller 1004 and column controller 1006 implementing the particular functionality. Output pulses can be transferred to selected bit lines by column controller 1006, for instance, or word lines by row controller 1004, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory, comprising:
   a set of two-terminal memory cells having respective first terminals connected to respective bitlines of a set of bit lines of the memory, and having respective second terminals connected to a first local wordline of a set of local wordlines of the memory, wherein a number of bitlines of the set of bit lines is less than a second number of local wordlines of the set of local wordlines, and a second local wordline of the set of local wordlines is connected to a second set of two-terminal memory cells that connect to respective bitlines of a second set of bit lines, wherein the first local wordline and the second local wordline are on a same row in an array of two-terminal memory cells;
   a power source configured to be selectively connected to or disconnected from respective ones of the set of local wordlines, wherein the first local wordline and the second local wordline are configured to be connected to or disconnected from the power source by a single global wordline of the memory; and
   a memory controller configured to perform memory operations for the memory, and configured to program a memory cell of the set of two-terminal memory cells at least in part by performance of operations comprising:
   activation of the single global wordline, and selective connection of the power source to the first local wordline and a second terminal of the memory cell, and selective electrical isolation of the power source from the second local wordline that is not connected to the memory cell; and
   application of a program signal from the power source to the first local wordline, wherein the program signal provides a higher potential to the first local wordline than a second voltage applied to a bitline of the set of bitlines that is connected to the memory cell.

2. The memory of claim 1, further comprising a set of global wordlines, including the single global wordline, configured respectively to electrically connect or disconnect respective sets of local wordlines on respective rows of the memory to the power source, wherein a ratio of the number of bitlines of the set of bit lines to a third number of global wordlines of the set of global wordlines is one half or less, and further wherein the memory controller is configured to cause the power source to be selectively insulated from a third local wordline on a different row from the first local wordline and the second local wordline, by deactivating a second global wordline of the set of global wordlines associated with the different row.

3. The memory of claim 1, further comprising an electrical ground configured to be selectively connected to or disconnected from respective ones of the set of bit lines.

4. The memory of claim 3, wherein the memory controller is further configured to program the memory cell by performance of the operations further comprising connection of the electrical ground to one of the set of bit lines that is connected to a first terminal of the memory cell.

5. The memory of claim 1, wherein the power source is further configured to be selectively connected to or disconnected from respective ones of the set of bitlines.

6. The memory of claim 5, wherein the memory controller is further configured to erase the memory cell at least in part by performance of the operations further comprising:
   selective connection of the power source to one of the set of bitlines connected to a first terminal of the memory cell; and
   application, from the power source, of the positive voltage or a second positive voltage having different magnitude from the positive voltage to the one of the set of bitlines.

7. The memory of claim 6, wherein the memory controller is further configured to erase the memory cell by performance of the operations further comprising connection of an electrical ground to the first local wordline.

8. The memory of claim 6, wherein the memory controller is further configured to erase the memory cell by performance of the operations further comprising application of a negative voltage from the power source to the first local wordline.

9. The memory of claim 1, wherein the memory cell is selected from one of the following: a resistive memory, a resistive-switching memory, a phase change memory, a magneto-resistive memory, an organic memory or a conductive bridging memory.

10. The memory of claim 1, wherein the second terminal of the memory cell is an ion donor component of the memory cell.

11. The memory of claim 1, wherein a first terminal of the memory cell is connected to one of the set of bitlines and is formed of a silicon or polysilicon material.

12. The memory of claim 1, wherein the first local wordline is electrically isolated from second terminals of the second set of two-terminal memory cells.

13. The memory of claim 12, wherein the first local wordline is electrically isolated from the respective bitlines of the second set of bitlines.

14. A method of operating a memory array, comprising:
   selecting a memory cell for programming in a sub-block of two-terminal memory cells comprising a number of bitlines that is less than a second number of non-global wordlines in a set of non-global wordlines traversing the sub-block, wherein a block of two-terminal memory cells comprising the sub-block is traversed by multiple sets of bitlines including the number of bitlines and is in part traversed by multiple sets of non-global wordlines including the set of non-global wordlines, wherein a first non-global wordline of a first set of non-global worldines and a second non-global wordline of a second set of non-global wordlines are positioned on a common row of the block of two-terminal memory cells and are respectively activated by a single global wordline;
   applying a program signal to the first non-global wordline, wherein the first non-global wordline is exclusive to the sub-block and is electrically connected to a first of two terminals of the memory cell and is insulated from the second non-global wordline, and wherein the second non-global wordline is electrically isolated from the sub-block of two-terminal memory cells; and applying a ground or a negative signal to a bitline of the number of bitlines that is electrically connected to a second of the two terminals of the memory cell, wherein the program signal provides a higher potential to the first non-global wordline than the ground or negative signal provides to the bitline.

15. The method of claim 14, further comprising applying a non-program signal to a second bitline of the number of bitlines within the sub-block.

16. The method of claim 14, wherein applying the program signal further comprises applying about four volts to the non-global wordline.

17. The method of claim 14, further comprising:
applying about two volts to second non-global wordline; and
applying about two volts to a second bitline of the number of bitlines.

18. The method of claim 14, wherein applying the program signal to the first non-global wordline further comprises:
activating the single global wordline that selectively connects, when activated, the first non-global wordline to a source line;
deactivating other global wordlines that selectively disconnect, when deactivated, other non-global wordlines of the set of non-global wordlines from the source line; and
applying the program signal to the source line.

19. The method of claim 18, wherein the memory cell is a resistive switching memory cell, and further wherein at least one of:
the first of the two terminals of the memory cell is an ion donor; or
the second of the two terminals of the memory cell is a silicon or polysilicon material.

20. The method of claim 14, further comprising:
erasing the memory cell by causing an electrical ground to connect to the first non-global wordline.

* * * * *